US010163680B1

(12) United States Patent
Hu et al.

(10) Patent No.: US 10,163,680 B1
(45) Date of Patent: Dec. 25, 2018

(54) SINKER TO BURIED LAYER CONNECTION REGION FOR NARROW DEEP TRENCHES

(71) Applicant: Texas Instruments Incorporated, Dallas, TX (US)

(72) Inventors: Binghua Hu, Plano, TX (US); Alexei Sadovnikov, Sunnyvale, CA (US); Scott Kelly Montgomery, Rowlett, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/709,039

(22) Filed: Sep. 19, 2017

(51) Int. Cl.
| | | |
|---|---|---|
| *H01L 21/762* | (2006.01) | |
| *H01L 27/088* | (2006.01) | |
| *H01L 29/78* | (2006.01) | |
| *H01L 29/06* | (2006.01) | |
| *H01L 21/265* | (2006.01) | |
| *H01L 21/8234* | (2006.01) | |
| *H01L 21/74* | (2006.01) | |
| *H01L 29/10* | (2006.01) | |

(52) U.S. Cl.
CPC .. *H01L 21/76237* (2013.01); *H01L 21/26586* (2013.01); *H01L 21/743* (2013.01); *H01L 21/823481* (2013.01); *H01L 21/823493* (2013.01); *H01L 27/088* (2013.01); *H01L 29/0649* (2013.01); *H01L 29/1083* (2013.01); *H01L 29/7816* (2013.01)

(58) Field of Classification Search
CPC ......... H01L 21/76237; H01L 21/26586; H01L 21/743; H01L 21/823481; H01L 21/823493; H01L 27/088; H01L 29/0649; H01L 29/7816
See application file for complete search history.

(56) References Cited

U.S. PATENT DOCUMENTS

| | | | | |
|---|---|---|---|---|
| 5,874,346 A | * | 2/1999 | Fulford, Jr. | ....... H01L 21/26586 257/E21.345 |
| 5,937,287 A | * | 8/1999 | Gonzalez | .......... H01L 21/76237 257/397 |
| 8,624,349 B1 | | 1/2014 | Blair | |
| 9,450,078 B1 | * | 9/2016 | Tang | ................. H01L 29/66795 |
| 2006/0124982 A1 | * | 6/2006 | Ho | ...................... H01L 27/0805 257/304 |
| 2007/0069324 A1 | * | 3/2007 | Takaishi | .............. H01L 29/0634 257/493 |

(Continued)

*Primary Examiner* — Nathan W Ha
(74) *Attorney, Agent, or Firm* — Andrew R. Ralston; Charles A. Brill; Frank D. Cimino

(57) ABSTRACT

A method of forming an IC includes forming a buried layer (BL) doped a second type in a substrate doped a first type. Deep trenches are etched including narrower inner trench rings and wider outer trench rings through to the BL. A first deep sinker implanting uses ions of the second type with a first dose, a first energy, and a first tilt angle. A second deep sinker implant uses ions of the second type with a second dose that<the first dose, a second energy>than the first energy, and a second tilt angle<the first tilt angle. The outer trench rings outside and inner trench rings are dielectric lined. The dielectric lining is removed from a bottom of the outer trench rings. The outer trench rings are filled with an electrically conductive filler material that contacts the substrate and fills the inner trench rings.

20 Claims, 15 Drawing Sheets

(56) References Cited

U.S. PATENT DOCUMENTS

| | | | |
|---|---|---|---|
| 2007/0080399 A1* | 4/2007 | Takaishi | H01L 29/0634 257/341 |
| 2007/0290258 A1* | 12/2007 | Son | H01L 21/26513 257/330 |
| 2009/0026586 A1* | 1/2009 | Anderson | H01L 21/26586 257/623 |
| 2009/0042359 A1* | 2/2009 | Lindsay | H01L 21/26506 438/433 |
| 2009/0053874 A1* | 2/2009 | Dubois | H01L 21/76237 438/433 |
| 2012/0061766 A1* | 3/2012 | Izumi | H01L 21/26586 257/369 |
| 2015/0076554 A1* | 3/2015 | Laven | H01L 29/6634 257/139 |
| 2015/0130016 A1* | 5/2015 | Kao | H01L 27/1463 257/510 |
| 2016/0093732 A1* | 3/2016 | Lee | H01L 29/7827 257/329 |
| 2018/0005830 A1* | 1/2018 | Laven | H01L 21/30621 |

* cited by examiner

US 10,163,680 B1

SINKER TO BURIED LAYER CONNECTION REGION FOR NARROW DEEP TRENCHES

FIELD

Disclosed embodiments relate to trench isolated semiconductor devices.

BACKGROUND

Integrated circuits (ICs) with high voltage capabilities have wide industrial applications, including power management systems used in automobiles. These integrated circuits include high voltage transistors that operate in a high voltage range (e.g., 80V to 120V) and low voltage transistors that operate in a much lower voltage range (e.g., 1V to 5V). To protect the low voltage transistors from the high voltage operations, an IC may adopt one or more electrical isolation schemes. For instance, one isolation scheme involves junction isolation comprising forming a buried layer (e.g., an N-type buried layer) within a bulk substrate and a sinker diffusion extending from the buried layer to the top surface of a bulk substrate (e.g., a P-type substrate) to junction isolate the high voltage transistors from the low voltage transistors. The N-type buried layer is typically biased by connecting it to a high voltage corresponding to the operating range of the high voltage transistors, whereas the P-type substrate is biased by connecting it to the lowest potential on the IC typically being ground. In some cases, the difference between the high bias voltage and the ground voltage may exceed a breakdown voltage threshold of a PN junction between the buried layer and the substrate, thereby causing leakage and impacting the performance and reliability of the IC.

Junction isolation may be combined with trench isolation. In this case dielectric filled trenches extend down to the buried layer and are surrounded by the sinker to form isolation trenches.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments include a method of forming an IC that includes forming a buried layer (BL) doped a second type in a substrate having at least one semiconductor layer that is doped a first type. Deep trenches are etched including narrower inner trench rings and wider outer trench rings outside the inner trench rings from a top surface of the semiconductor layer through to the BL. A first deep sinker implant comprises implanting ions of the second type with a first dose, a first energy, and a first tilt angle. A second deep sinker implanted implants ions of the second type with a second dose that is<the first dose, a second energy that is higher>than the first energy, and a second tilt angle that is<the first tilt angle. The outer trench rings and inner trench rings are etched to extend their trench depth, are then dielectric lined. The dielectric lining is removed from a bottom of the outer trench rings, and the outer trench rings are filled with an electrically conductive filler material that electrically contacts the substrate layer and fills the inner trench rings.

BRIEF DESCRIPTION OF THE DRAWINGS

Reference will now be made to the accompanying drawings, which are not necessarily drawn to scale, wherein.

DETAILED DESCRIPTION

Figure 1A:
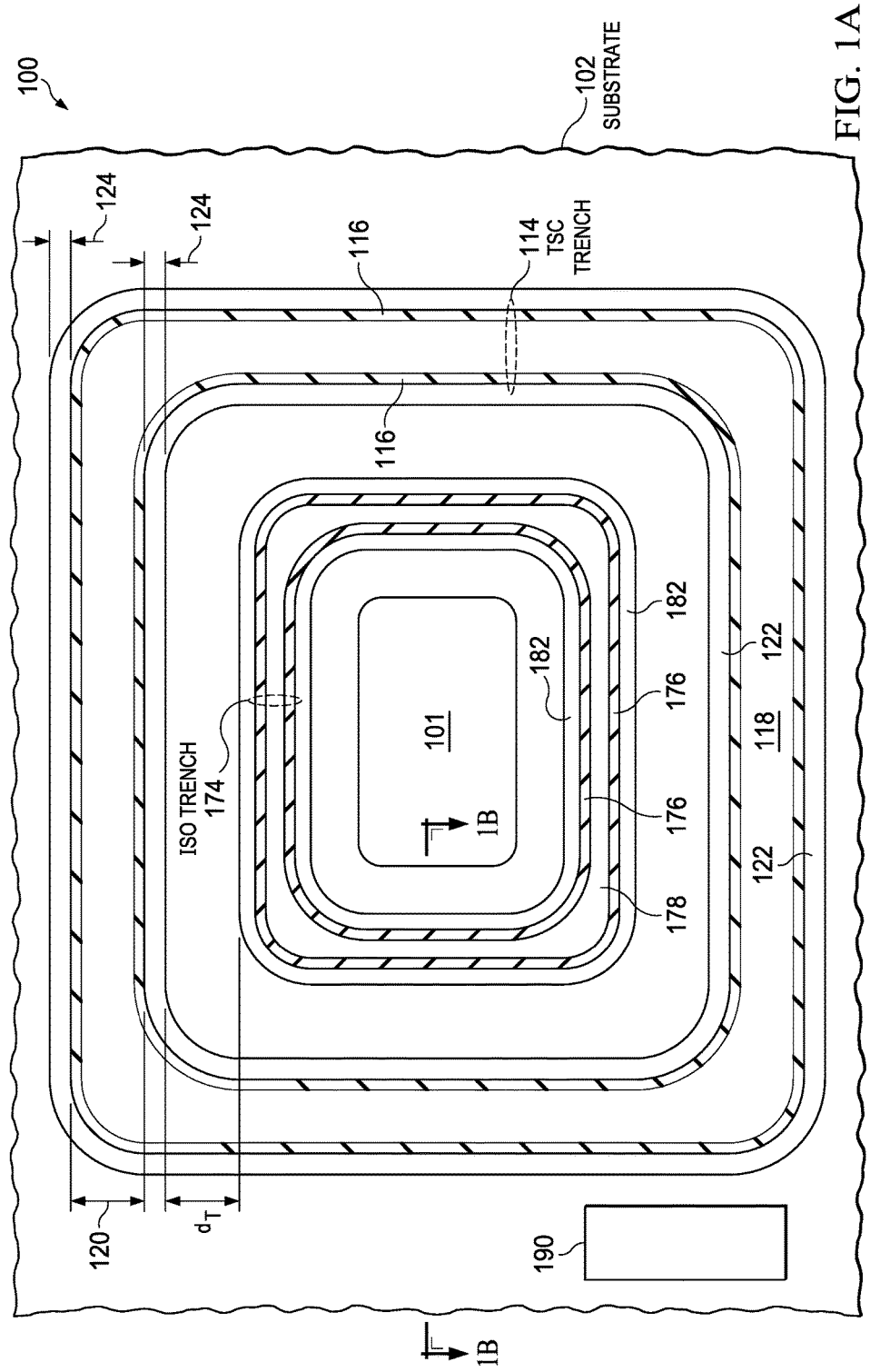
FIG. 1A shows a top view of an example semiconductor IC with a dual-trench where the inner trench is an isolation trench that includes a sinker including a disclosed sinker to buried layer connection region, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

One disclosed high voltage process flow includes deep dual-trenches for isolating devices including both inner smaller area deep isolation trenches and outer larger area generally doped polysilicon filled deep top-side-contact (TSC) trenches. For example, regarding automotive applications, with the push for an automotive 48V battery, there is a requirement to have a dual-trench bipolar-CMOS-DMOS (BCD) IC technology to provide a>100V breakdown voltage rated device as opposed to the more traditional 60V to 85V breakdown voltage rated device. It is known in the art to be difficult to modify an existing process technology which is for example 85V rated, and increase its voltage rating to≥100V.

Disclosed embodiments recognize one way to increase the voltage rating of an IC from for example 85V to 100V is to use dual-deep trenches (DTs) including a baseline DT width for an electrically conductive fill material filled deep TSC trench (e.g., a trench width about 2.65 am) and an inner trench with a significantly narrower DT width (e.g., at least 20% narrower, typically at least 40% narrower) referred to herein as an isolation trench. The isolation trench prevents the electrically conductive fill material (generally doped polysilicon) in the trench from shorting to the substrate as it is intended for the TSC trench which use a substrate connection, so that the isolation trench can now be left electrically floating (e.g., because of silicon oxide on its bottom) to help increase the breakdown voltage, such as in the case of a p-substrate between an N+ buried layer (NBL) and the p-substrate/polysilicon inside the trenches with the TSC trench making substrate layer contact.

However, a new problem recognized herein is that with such dual-trenches for the narrower isolation trench is there is a resulting high resistance connection in the case of a p-substrate between the DeepN sinker and the NBL which is due to a shallower DeepN sinker implant being provided near the narrower isolation trenches as compared to the implanted depth of the DeepN implant around the wider TSC trenches. For example, the DeepN sinker implant can comprise a high dose phosphorous implant (e.g., $>1\times10^{15}$ cm$^{-2}$) with a 16 degree tilt defined for the wider TSC trenches. Disclosed embodiments solve this high resistance connection problem by adding a second deepN-type (e.g., phosphorous) sinker implant with a higher energy, smaller tilt angle and a significantly lower implant dose (all compared to a single DeepN sinker implant) to provide a disclosed sinker to buried layer connection region which ensures that the DeepN sinker provides a low resistance contact to the NBL around the narrower isolation trenches.

This second deepN sinker implant has been found to not measurably shift the breakdown voltages between any of the TSC or isolation trench to adjacent wells (due to the lower implant dose, and moreover does not induce slip line or other crystal defects (also due to the lower implant dose). Although described herein applied to p-type substrates, disclosed embodiments can also be applied to n-type substrates, where in that case it is a DeepP sinker and a PBL that receives a second deep p-type (e.g., boron) sinker implant with a smaller tilt angle and a significantly lower implant dose (both compared to a single baseline DeepP implant) to solve the same high resistance sinker to BL connection problem.

Figure 1B:
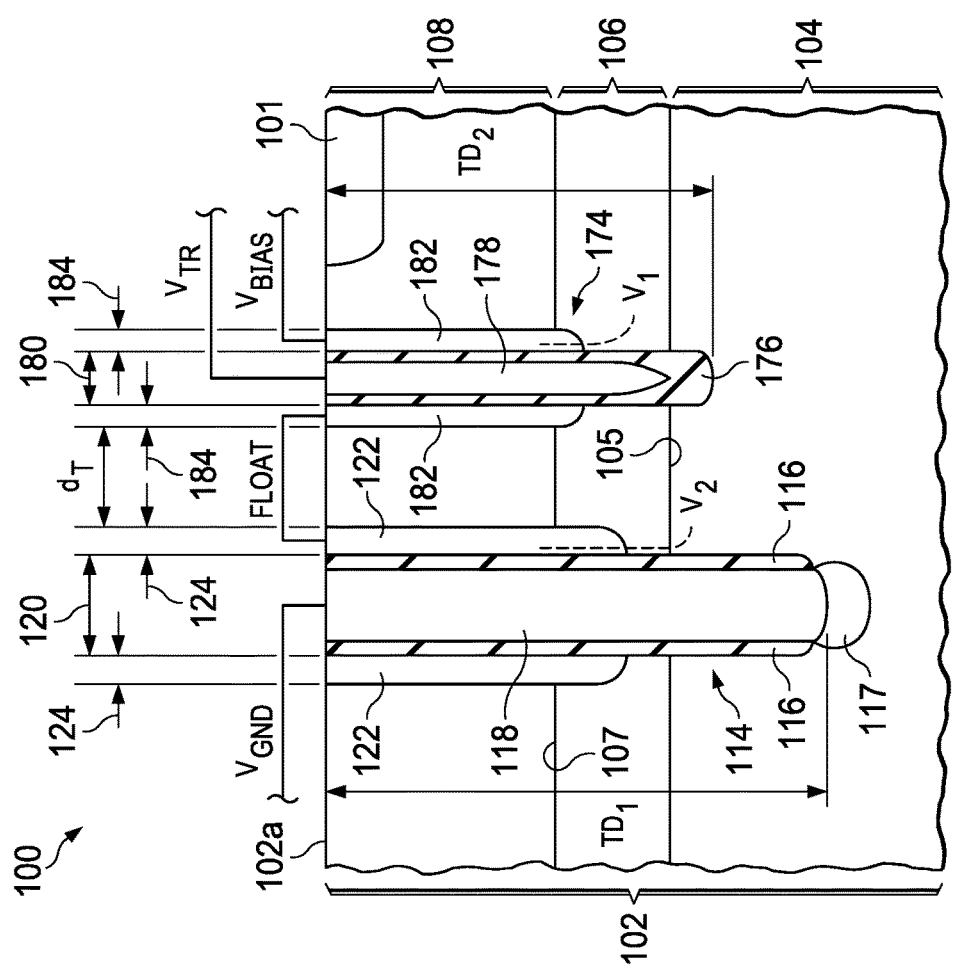
FIG. 1B shows a cross-sectional view of the semiconductor IC shown in FIG. 1A.

FIG. 1A shows a top view of an example semiconductor IC 100 with a disclosed dual-trench configuration where the inner trench is an isolation trench 174 that includes a disclosed second vertical doped structure (hereafter second 'sinker') 182 having a sinker to buried layer connection region, according to an example embodiment. FIG. 1B shows a cross-sectional view of the semiconductor IC 100 in FIG. 1A where the BL is shown as 106. The outer trench is a TSC trench 114 that is wider than the isolation trench 174.

The isolation trench 174 is arranged to laterally surround the transistor well region 101 and intersect the buried layer 106. More specifically, the isolation trench 174 extends from the top surface 102a of the substrate 102 to penetrate the buried layer 106. In one implementation, for example, the isolation trench 174 may penetrate through the BL 106 to reach the lower semiconductor layer 104 of the substrate 102. In another implementation, for example, the isolation trench 174 may partially penetrate the BL 106 and terminate within the BL 106. The isolation trench 174 is interposed between the TSC trench 114 and the transistor well region 101.

As shown in FIG. 1A, the isolation trench 174 circumscribes the transistor well region 101, while being circumscribed by the TSC trench 114. Together, the trenches 114, 174 establish two contiguous rings for isolating the transistor well region 101. In an alternative implementation, each of the trenches 114 and 174 may be divided into disconnected and discrete segments to approximate a contiguous ring for isolating the inner transistor well region 101. The dual-trench configuration alleviates electric field crowding around the first PN junction 105 (see FIG. 1B) between the BL 106 and the lower semiconductor layer 104 of the substrate 102.

The trench width for the isolation trenches 174 is generally less than the trench width of the TSC trench 114, which is shown in both FIG. 1A and FIG. 1B. As these trench types are generally simultaneously etched, this trench width difference will result in the trench depth for the isolation trench 174 being less than the trench width of the TSC trench 114. The trench depth for the isolation trenches 174 and TSC trench 114 can range from 2 µm to 15 µm. The TSC trench 114 may have a trench width of 2 µm to 4 µm, such as 2.65 µm+/−10%, and the isolation trench 174 may have a trench width of 1.7 µm+/−10%. The TSC trench 114 is generally spaced apart from the isolation trench 174 by a distance greater than 1 µm.

The substrate 102 as shown in FIG. 1B is shown subdivided into a lower semiconductor layer 104, a BL 106 and an upper semiconductor layer 108. The lower semiconductor layer 104 forms a bottom surface of the substrate 102, whereas the upper semiconductor layer 108 forms a top surface 102a of the substrate 102. The lower semiconductor layer 104 may be, for example, a part of a bulk silicon substrate (e.g., 102), an epitaxial layer on a bulk silicon wafer, or the handle 'wafer' of a silicon-on-insulator (SOI) wafer. The upper semiconductor layer 108 may be an epitaxial layer formed above the lower semiconductor layer 104 of the substrate 102, or as an extension of a bulk silicon substrate (e.g., 102). The lower and upper semiconductor layer 104 and 108 typically have the same conductivity type (e.g., P-type).

The BL 106 may be formed by doping the lower semiconductor layer 104. Alternatively, the BL 106 may be formed by growing an epitaxial layer with in situ doping on top of the lower semiconductor layer 104. The BL 106 has the opposite conductivity type from lower semiconductor layer 104 and upper semiconductor layer 108. As such, as shown in FIG. 1B, the BL 106 forms a first PN junction 105 with the lower semiconductor layer 104 and a second PN junction 107 with the upper semiconductor layer 108. The BL 106 may have an average doping density of at least $1\times10^{18}$ cm$^{-3}$. A top boundary 112 of the BL 106 (see FIG. 2A described below) is generally at least 2 microns below the top surface 102a of the substrate 102, and may extend 5 microns to 10 microns below the top surface 102a of the substrate 102. The BL 106 may extend laterally across the semiconductor IC 100 as depicted in FIG. 1B, or alternatively, the BL 106 may be formed within a finite lateral region that is coplanar with the substrate 102.

The semiconductor IC 100 includes a transistor well region 101 that is positioned within the upper semiconductor layer 108 and above the BL 106. The transistor well region 101 includes transistors configured for forming one or more active circuits. In the event that the transistor well region 101 includes a low voltage circuit (e.g., a circuit that operates with less than 10V), the transistor well region 101 is isolated and protected from a high voltage circuit (e.g., a circuit that operates with more than 50V) formed outside of the transistor well region 101 shown as 190 shown in FIG. 1A which can comprise a laterally diffused metal-oxide-semiconductor (LDMOS) transistor. As used herein, an LDMOS device is synonymous with a diffused metal oxide semiconductor (DMOS) or drain extended MOS (DEMOS) device and can include both n-channel LDMOS (NLDMOS) and p-channel PLDMOS devices. In an NLDMOS transistor, as known in the art, the drain is laterally arranged to allow current to laterally flow, and an n-drift region is interposed between the channel and the drain to provide a high drain to source breakdown voltage (BV). Alternatively, in the event that the transistor well region 101 includes a high voltage circuit, the transistor well region 101 is isolated to protect a low voltage circuit formed outside of the transistor well region 101.

To electrically isolate high voltage circuitry from the low voltage circuitry, the semiconductor IC 100 also includes TSC trenches 114 arranged to laterally surround the transistor well region 101 and intersect the BL 106. The TSC trenches 114 and isolation trenches 174 both extend from the top surface 102a to penetrate through the BL 106, thereby reaching the lower semiconductor layer 104. The TSC trench 114 includes a first dielectric liner 116 disposed along its sidewalls. The first dielectric liner 116 may include thermal or deposited silicon dioxide. The TSC trench 114 defines a bottom opening for accessing the lower semiconductor layer 104 of the substrate 102. The access point is doped with a dopant of the same conductivity type as the lower semiconductor layer 104 to form a doped region 117 for the TSC trench 114.

The TSC trench 114 includes first trench fill material 118 disposed onto the first dielectric liners 116. The first trench fill material 118 is electrically conductive, and it is dielectrically isolated from the upper semiconductor layer 108 and the BL 106. In one implementation, for example, the first trench fill material 118 includes polycrystalline silicon, which is commonly referred to as polysilicon. The first trench fill material 118 establishes an ohmic contact with the lower semiconductor layer 104 of the substrate 102 via the bottom opening and the doped region 117. Through this ohmic contact, the first trench fill material 118 of the TSC trench 114 can be used for biasing the lower semiconductor layer 104 of the substrate 102. In one implementation, for example, the first trench fill material 118 may be structured to receive a ground supply voltage $V_{GND}$ to bias the lower semiconductor layer 104 of the substrate 102.

When being biased at a voltage $V_{BIAS}$ corresponding to the operation voltage range of the high voltage circuit, the BL 106 can be used as an isolation structure as well. For instance, where the operation voltage range of the high voltage circuit is between 80V and 100V, the bias voltage $V_{BIAS}$ of the buried layer 106 may range from 100V to 170V. To bias the BL 106, the semiconductor IC 100 includes first sinkers 122 that extend from the top surface 102a to reach the BL 106. The first sinkers 122 are doped with dopants of the same conductivity type as the BL 106 so as to provide electrical connections to the BL 106. In one implementation, for example, the first sinkers 122 are doped with N-type materials where the BL 106 is N-doped as well.

For self-alignment purposes, the first sinkers 122 may be formed alongside the TSC trench 114. The first sinkers 122 extend laterally from the TSC trench 114 to have a thickness 124, and the first sinkers 122 coextend with the TSC trench 114 to provide an electrically conductive path between the top surface 102a and the buried layer 106. In one implementation, the thickness 124 of the first sinkers 122 is less than 2.5 microns, which may advantageously reduce the size of the semiconductor IC 100 when compared to ICs without self-aligned sinkers.

As shown in FIG. 1A, the TSC trench 114 and the first sinkers 122 form a contiguous ring that circumscribes the transistor well region 101. In an alternative implementation, the TSC trench 114 and the first sinkers 122 may be arranged as disconnected and discrete segments to approximate the contiguous ring for isolating the transistor well region 101.

During operations of semiconductor IC 100, the upper semiconductor layer 108 may incur a relatively high voltage where the transistor well region 101 includes one or more high voltage circuits. For example, the upper semiconductor layer 108 may incur a voltage ranges from 80V to 100V. To prevent a current from crossing the second PN junction 107 (e.g., due to a forward bias), the BL 106 is biased with a voltage $V_{BIAS}$ that is higher than the voltage incurred by the upper semiconductor layer 108. In one implementation, for example, the bias voltage $V_{BIAS}$ may range from 100V to 170V. In another implementation, for example, the bias voltage $V_{BIAS}$ may range from 140V to 170V. In yet another implementation, for example, the bias voltage $V_{BIAS}$ may range from 145V to 155V.

When the lower semiconductor layer 104 is biased at a ground supply voltage $V_{GND}$, the potential difference between the BL 106 and the lower semiconductor layer 104 can become significantly large. When this potential difference becomes larger than the breakdown voltage (e.g., less than 80V) of the first PN junction 105, the semiconductor IC 100 may experience a substantial amount of current leakage. This potential difference can be illustrated by an electric field density spread across a high electric field line $V_1$ and a low electric field line $V_2$. In general, the high electric field line $V_1$ represents a potential distribution closer to the bias voltage $V_{BIAS}$, and the low electric field line $V_2$ represents a potential distribution closer to the ground supply voltage $V_{GND}$. The likelihood of having a breakdown at the first PN junction 105 is directly proportional to the potential difference between $V_1$ and $V_2$, and inversely proportional to a distance between $V_1$ and $V_2$.

Thickening the first dielectric liner 116 may help increase the low electric field line $V_2$ as the ground potential carried by the first trench fill material 118 exerts less capacitive coupling to the adjacent p-region of the lower semiconductor layer 104. By increasing the low electric field line $V_2$, the potential difference between $V_1$ and $V_2$ can be reduced to lower the likelihood of having a breakdown along the first PN junction 105. This approach may be less effective where $V_1$ is substantially higher than $V_2$ (e.g., $V_1-V_2 \geq 100V$) and the maximum thickness of the first dielectric liner 116 is limited by one or more process parameters.

Increasing the thickness of the BL 106 (e.g., thickness of the buried layer $\geq 12$ μm) may help reduce the electric field density between $V_1$ and $V_2$ to avoid electric field crowding along the first PN junction 105. By reducing the electric field density, the potential gradient at the first PN junction 105 can be reduced to lower the likelihood of having a breakdown along the first PN junction 105. This approach may be costly where $V_1$ is substantially higher than $V_2$ (e.g., $V_1-V_2 \geq 100$ v) because a thickened BL 106 typically requires more material and time to develop, and it can be more difficult to etch in forming the TSC trench 114.

The BL 106 may include an upper portion with a first doping concentration and a lower portion with a second doping concentration that is lower than the first doping concentration. For instance, the upper BL portion may have a doping concentration that is greater than $5\times10^{18}$ cm$^{-3}$, whereas the lower BL portion may have a doping concentration ranging from $1\times10^{16}$ cm$^{-3}$ to $1\times10^{17}$ cm$^{-3}$. By adjusting the doping profile within the BL 106, the potential gradient across the first PN junction 105 can be reduced to lower the likelihood of having a breakdown. This approach may be less effective where $V_1$ is substantially higher than $V_2$ (e.g., $V_1-V_2 \geq 100$ v) and the maximum thickness of the BL 106 is limited (e.g., maximum thickness≤12 μm).

To facilitate an efficient trench etching process and an efficient dielectric filing process, the isolation trench 174 may be formed concurrently with the TSC trench 114. To that end, the isolation trench 174 may have a second trench width (i.e., second trench aperture) 180 that is less than the first trench width (i.e., first trench aperture) 120 of the TSC trench 114. In one implementation, for example, the trench width 180 of the isolation trench 174 ranges from 1.5 μm to 1.8 μm, whereas the first trench width 120 of the TSC trench 114 is about 2.65 μm+/−10%. In another implementation, for example, the trench width 180 of the isolation trench 174 is about 1.7 μm+/−10%, whereas the first trench width 120 of the TSC trench 114 is about 2.65 μm+/−10%.

Due to the difference in trench widths as described above, as shown in FIG. 1B the TSC trench 114 has a first trench depth $TD_1$ that is greater than a second trench depth $TD_2$ of the isolation trench 174 when they are simultaneously etched for the same amount of time. In one implementation, for example, the first trench depth $TD_1$ ranges from 20 μm to 28 μm, whereas the second trench depth $TD_2$ can range from 8 μm to 16 μm. In another implementation, for example, the first trench depth $TD_1$ ranges from 23 μm to 27 μm, whereas the second trench depth $TD_2$ ranges from 13 μm to 15 μm. In yet another implementation, for example, the first trench depth $TD_1$ is about 24 μm+/−10%, whereas the second trench depth $TD_2$ is about 14 μm+/−10%.

Alternatively, the isolation trench 174 may have a second trench width 180 that is substantially the same (e.g., +/−5% margin) as the first trench width 120 of the TSC trench 114. Under this particular configuration, the first trench depth $TD_1$ may be substantially the same (e.g., +/−5% margin) as the second trench depth $TD_2$. In one implementation, for example, $TD_1$ and $TD_2$ range from 20 μm to 28 μm. In another implementation, for example, $TD_1$ and $TD_2$ range from 23 μm to 27 μm. In yet another implementation, for example, $TD_1$ and $TD_2$ are about 24 μm+/−10%.

Similar to the TSC trench 114, the isolation trench 174 includes second dielectric liners 176 disposed along the sidewalls and a bottom portion of thereof. The second dielectric liners 176 may comprise thermal silicon dioxide. The second dielectric liner 176 dielectrically isolates the isolation trench 174 to prevent access to the lower semiconductor layer 104 of the substrate 102. When the second trench width 180 is smaller than the first trench width 120, a simultaneous dielectric formation process may cause the second dielectric liners 176 to be slightly sloped and thicker around the bottom portion of the isolation trench 174.

The isolation trench 174 includes second trench fill material 178 disposed onto the second dielectric liners 176. The second trench fill material 178 is electrically conductive where the isolation trench 174 is configured to receive a trench bias voltage $V_{TR}$. Alternatively, the second trench fill material 178 may be either electrically conductive or non-conductive where the isolation trench 174 is configured to a floating state. In a configuration where the second trench fill material 178 is conductive, the second trench fill material 178 is electrically insulated from the upper semiconductor layer 108, the BL 106, and the lower semiconductor layer 104. In one implementation, for example, the second trench fill material 178 includes polycrystalline silicon, which is commonly referred to as polysilicon. Unlike the first trench fill material 118, the second trench fill material 178 does not establish any ohmic contact with the lower semiconductor layer 104 of the substrate 102. Rather, the second trench fill material 178 establishes a capacitive coupling with the BL 106 and the lower semiconductor layer 104. Through this capacitive coupling, the second trench fill material 178 can be used for influencing the electric field density of the BL 106, as well as the lower semiconductor layer 104 of the substrate 102. In one implementation, for example, the second trench fill material 178 may be structured to receive a trench bias voltage $V_{TR}$ to reduce the electric field density around the first PN junction 105 between the BL 106 and the lower semiconductor layer 104.

Semiconductor IC 100 includes second sinkers 182 that include a disclosed sinker to buried layer connection region, which serve as a conduit for biasing the BL 106 to a bias voltage $V_{BIAS}$, thereby establishing a reverse bias between the P-type upper semiconductor layer 108 and the N-type BL 106. The second sinkers 182 extend from the top surface 102a to reach the BL 106. The second sinkers 182 are doped with dopants of the same conductivity type as the BL 106 so as to provide electrical connections to the BL 106. In one implementation, for example, the second sinkers 182 are doped with N-type materials where the BL 106 is N-doped as well.

For self-alignment purposes, the second sinkers 182 may be formed alongside the isolation trench 174. The second sinkers 182 extend laterally from the isolation trench 174 to have a thickness 184, and the second sinkers 182 coextend with the isolation trench 174 to provide a conductive path between the top surface 102a and the BL 106. In one implementation, the thickness 184 of the sinkers may be less than 2.5 microns, which may advantageously reduce the size of the semiconductor IC 100 when compared to ICs without self-alignment sinkers. When the second trench width 180 is less than the first trench width 120, the sinker thickness of the second trench may be less than that of the first trench.

The dual-trench configuration provides several advantages over the single-trench configuration in sustaining a high operation voltage range while preventing breakdowns around an isolation junction. The first advantage includes widening the electric field line distributions between the high electric field line $V_1$ and the low electric field line $V_2$ shown in FIG. 1B. The widened distribution reduces the potential difference around the first PN junction 105. As shown in FIG. 1B, for example, the high electric field line V1 and the low electric field line V2 are spaced further apart, such that the potential difference across the first PN junction 105 may be substantially reduced.

The widened distribution of electric field lines can be attributed to the structural features of the isolation trench 174. In one aspect, by not establishing any ohmic contact with, and thus not biasing, the substrate 102, the isolation trench 174 helps sustain a relatively low potential difference across the first PN junction 105 around a region surrounding the isolation trench 174. In another aspect, the isolation trench 174 helps reduce the potential difference across the first PN junction 105 by having a thicker dielectric liner around the bottom portion thereof. In yet another aspect, the relative positioning of the isolation trench 174 helps spread the electric field lines between a biased sinker and a floating sinker. By virtue of being interposed between the TSC trench 114 (which is configured to carry a ground supply voltage $V_{GND}$ (e.g., 0V)) and the biased region of the BL 106 (which is biased at a high bias voltage $V_{BIAS}$ (e.g., 100V to 170V), the isolation trench 174 serves as a voltage buffer between these two regions.

The inter-trench distance $d_T$ between the TSC trench 114 and the isolation trench 174 is associated with a breakdown voltage of the first PN junction 105 between the BL 106 and the lower semiconductor layer 104 of the substrate 102. Generally, the breakdown voltage is inversely proportional to the inter-trench distance $d_T$. In one implementation, for example, an inter-trench distance $d_T$ of at least 1 µm may be sufficient to prevent junction breakdown of the first PN junction 105 where the breakdown voltage of 100V or lower. In another implementation, for example, an inter-trench distance $d_T$ of about 1.5 µm+/−10% may be sufficient to prevent junction breakdown of the first PN junction 105 where the breakdown voltage is about 80V+/−10%.

The inter-trench distance $d_T$ may also be associated with an electric field density threshold of the first PN junction 105 between the BL 106 and the lower semiconductor layer 104 of the substrate 102. Assuming the semiconductor IC 100 has an electric field density of 10 v/µm, the inter-trench distance $d_T$ is about (e.g., +/−10% margin) 2 µm to sustain a 20V potential difference between the high electric field line $V_1$ and the low electric field line $V_2$. Similarly, assuming the semiconductor IC 100 has an electric field density threshold of 20V/µm, the inter-trench distance $d_T$ is about 1 µm+/−10% to sustain a 20V potential difference between the high electric field line $V_1$ and the low electric field line $V_2$. Under these assumptions, the inter-trench distance $d_T$ is inversely proportional to the electric field density threshold of the first PN junction 105.

The second advantage of the dual-trench configuration includes lowering the potential spectrum across the high electric field line $V_1$ and the low electric field line $V_2$. In an implementation where the second trench fill material 178 is electrically conductive, the isolation trench 174 can be configured to receive the trench bias voltage $V_{TR}$ shown in FIG. 1B. The trench bias voltage $V_{TR}$ may lower the value of the high electric field line $V_2$ relative to the bias voltage $V_{BIAS}$ as applied to the BL 106. In one example, the high electric field line $V_2$ may be reduced to 100V where the bias voltage $V_{BIAS}$ is set to 140V and the trench bias voltage $V_{TR}$ is set to 40V. Similarly, the high electric field line $V_2$ may be reduced to 80V where the bias voltage $V_{BIAS}$ is set to 140V and the trench bias voltage $V_{TR}$ is set to 60V.

To avoid junction breakdowns, the trench bias voltage $V_{TR}$ can be associated with a breakdown voltage of the first PN junction 105 between the BL 106 and the lower semiconductor layer 104 of the substrate 102. In one implementation, for example, the trench bias voltage $V_{TR}$ can be set to 40V where the breakdown voltage is 80V and the BL bias voltage $V_{BIAS}$ is less than 120 v. In another implementation, for example, the trench bias voltage $V_{TR}$ can be set to 60V where the break down voltage is 60V and the BL bias voltage $V_{BIAS}$ is less than 120V. Under these examples, the trench bias voltage $V_{TR}$ is inversely proportional to the breakdown voltage of the first PN junction 105 between the BL 106 and the lower semiconductor layer 104 of the substrate 102.

And to avoid electric field crowding, the trench bias voltage $V_{TR}$ can also be associated with an electric field density threshold of the first PN junction 105 between the BL 106 and the lower semiconductor layer 104 of the substrate 102. Assuming the semiconductor IC 100 has an electric field density of 10V/µm and an inter-trench distance $d_T$ of 2 µm, the trench bias voltage $V_{TR}$ can be set to 40V to sustain a 80V potential difference between the high electric field line $V_1$ and the low electric field line $V_2$ where the buried layer bias voltage $V_{BIAS}$ is at 140V. Similarly, assuming the semiconductor IC 100 has an electric field density of 20V/µm and an inter-trench distance $d_T$ of 2 µm, the trench bias voltage $V_{TR}$ can be set to 20V to sustain a 80V potential difference between the high electric field line $V_1$ and the low electric field line $V_2$ where the buried layer bias voltage $V_{BIAS}$ is at 140V. Under these assumptions, the trench bias voltage $V_{TR}$ is inversely proportional to the electric field density threshold of the first PN junction 105.

Figure 2A:
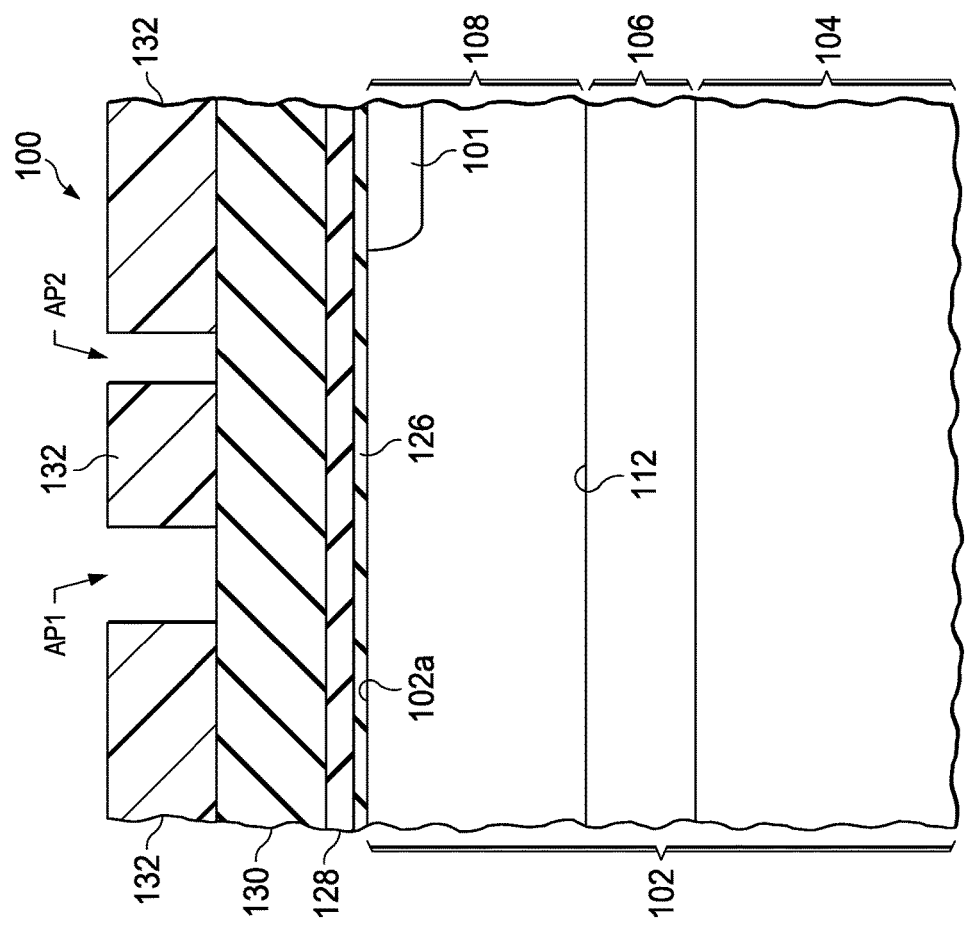
FIGS. 2A-2H are cross-sectional diagrams showing processing progression for an example method of forming an IC having dual-trench isolated devices, where the inner trench is an isolation trench that includes a sinker including a disclosed sinker to buried layer connection region, according to an example embodiment.

FIGS. 2A-2H show an example manufacturing process depicting cross-sectional views of the semiconductor IC 100 with a dual-trench configuration including an outer TSC trench 114 and an isolation trench 174 inside the TSC trench that includes a sinker having a disclosed sinker to buried layer connection region. Referring to FIG. 2A, the BL 106 and the upper semiconductor layer 108 are on the lower semiconductor layer 104. The BL 106 and the upper semiconductor layer 108 may be formed by implanting N-type dopants into the P-type lower semiconductor layer 104, followed by a thermal drive and a subsequent epitaxial growth process to grow the P-type upper semiconductor layer 108, so that the BL 106 is formed by diffusion and activation of the implanted N-type dopants. After the upper semiconductor layer 108 is formed, a transistor well region 101 is formed within the upper semiconductor layer 108 and above the BL 106.

A pad oxide layer 126 is formed at the top surface 102a of the substrate 102, for example formed by thermal oxidation. The pad oxide layer 126 may comprise 5 nanometers to 30 nanometers of silicon dioxide. A pad nitride layer 128 is formed on the pad oxide layer 126, for example by low pressure chemical vapor deposition (LPCVD) using ammonia and silane. The pad nitride layer 128 may comprise 100 nanometers to 300 nanometers of silicon nitride. A hard mask oxide layer 130 is formed over the pad nitride layer 128, for example by a plasma enhanced chemical vapor deposition (PECVD) using tetraethyl orthosilicate, which is also known as tetraethoxysilane (TEOS), or using a high density plasma (HDP) process. The hard mask oxide layer 130 may comprise 500 nanometers to 2 microns of silicon dioxide. The pad nitride layer 128 provides an etch stop layer for subsequent etching of the hard mask oxide layer 130.

A trench mask 132 shown in FIG. 2A is formed over the hard mask oxide layer 130 so as to expose areas for forming the TSC trench 114 and the isolation trench 174 as shown and described in FIGS. 1A and 1B. More specifically, the trench mask 132 is patterned with a first aperture AP1 and a second aperture AP2. The first aperture AP1 defines the first trench width 120, whereas the second aperture AP2 defines the second trench width 180, where the first trench width 120 and second trench width 180 are shown in FIG. 1B. AP1 is generally larger than AP2. In one implementation, for example, as described above, the AP2 ranges from 1.5 µm to 1.8 µm, whereas the AP1 is about 2.65 µm+/−10%. In another implementation, for example, AP2 is about 1.7 µm+/−10%, whereas AP1 is about 2.65 µm+/−10%. The trench mask 132 may include a photoresist material defined by a photolithographic process, and may further include a hard mask layer and/or an anti-reflection layer.

Figure 2B:
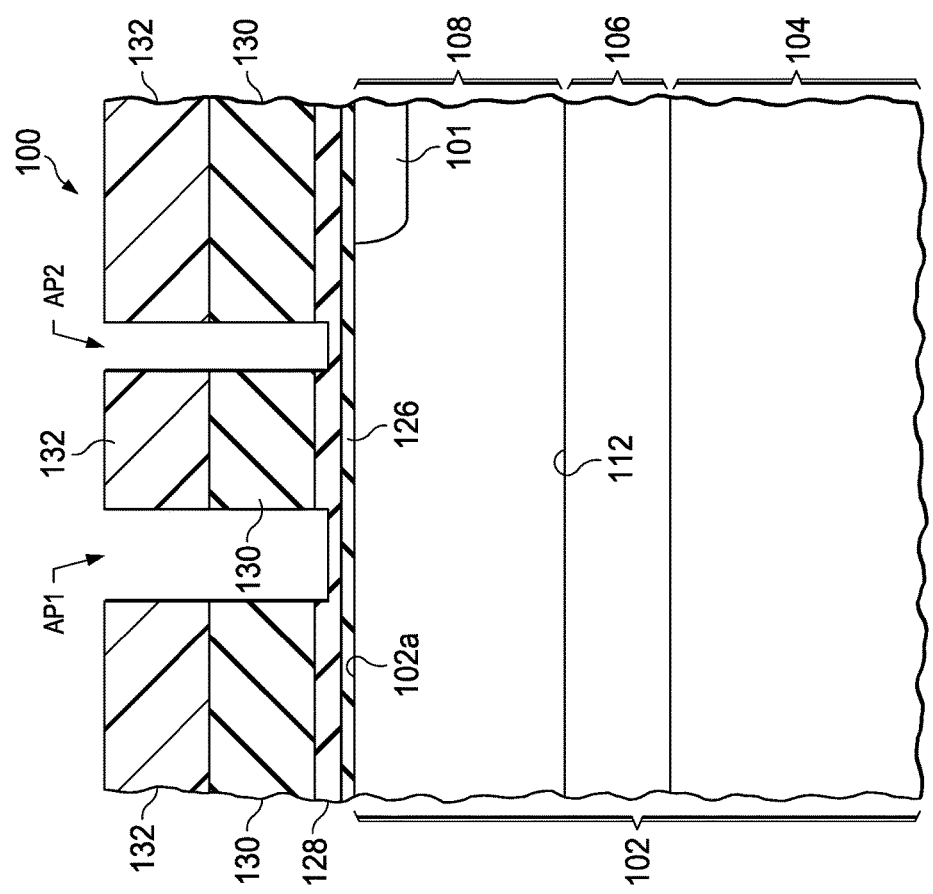

Referring to FIG. 2B, a hard mask etch process removes material from the hard mask oxide layer 130 in the areas exposed by the trench mask 132. The hard mask etch process may include a reactive ion etch (RIE) process using fluorine radicals, and/or may include a wet etch process using a dilute buffered aqueous solution of hydrofluoric acid. A portion of the pad nitride layer 128 may be removed by the hard mask etch process, as depicted in FIG. 2B. A portion or all of the trench mask 132 may be eroded by the hard mask etch process.

Figure 2C:
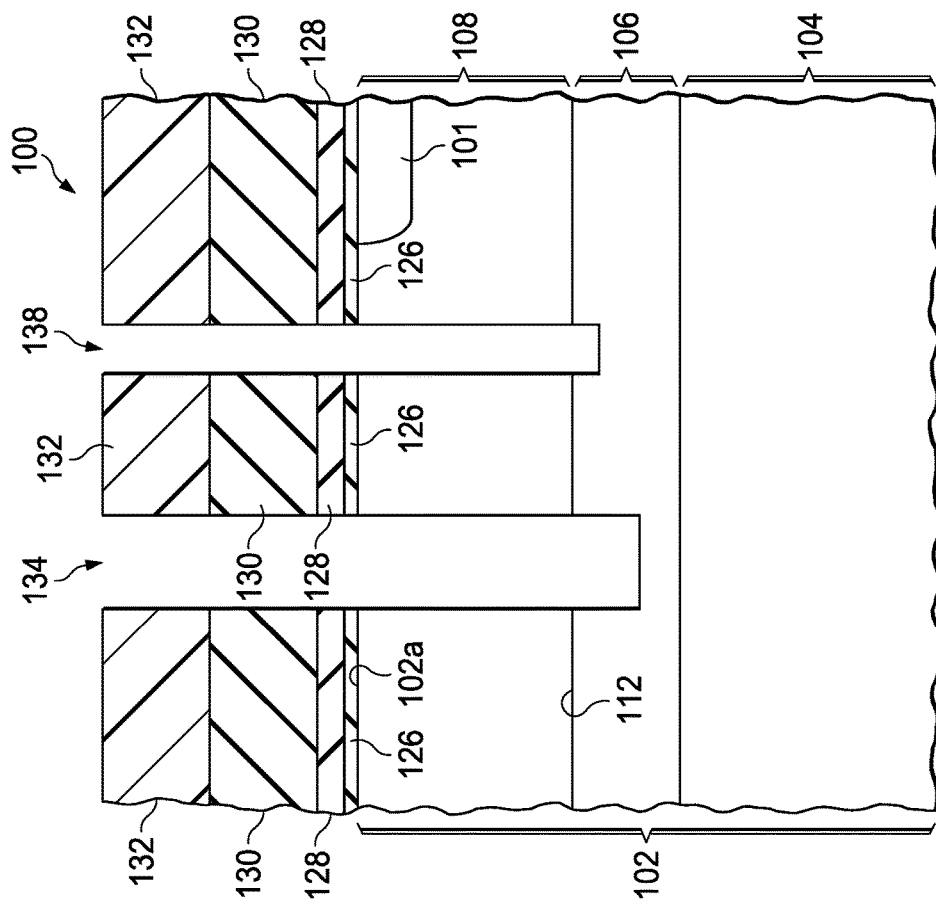

Referring to FIG. 2C, a stop layer etch process removes the pad nitride layer 128 and the pad oxide layer 126 in the areas exposed by the trench mask 132. The stop layer etch process may include an RIE process with a different combination of gases from the hard mask etch process discussed above in reference to FIG. 2B. The trench mask 132 may be further eroded by the stop layer etch process.

The stop layer etch includes a first trench etch process removing material from the substrate 102 in the areas exposed by the trench mask 132 to simultaneously form a first partial deep trench 134 that will become a TSC trench and a second partial deep trench 138 that will become an isolation trench. The first trench etch process can comprise RIE. The first partial deep trench 134 extends to the BL 106 deeper than the second partial deep trench 138 given the first aperture AP1 was wider than the second aperture AP2. The trench depth of the first partial deep trench 134 is typically 8.5 μm±2 μm. The first trench etch process may include a continuous etch process which simultaneously removes material from the bottoms of the first and second partial deep trenches 134 and 138, as well as passivates sidewalls of the first and second partial deep trenches 134 and 138. Alternatively, the first deep trench etch process may include a two-step process. During the first step, the first deep trench etch process removes material from the bottoms of the first and second partial deep trenches 134 and 138. During the second step, the first deep trench etch process removes passivates sidewalls of the first and second partial deep trenches 134 and 138. The trench mask 132 may be further eroded by the first trench etch process.

Figure 2D:
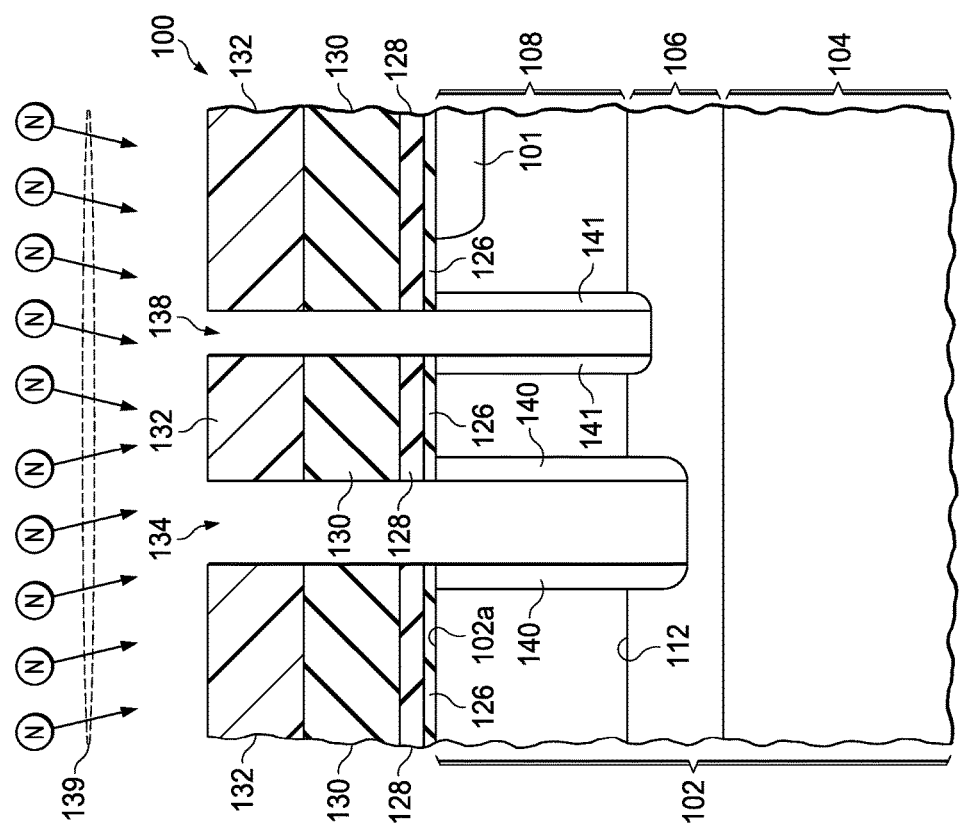

Referring to FIG. 2D, N-type dopants 139 are first DeepN sinker implanted into the substrate 102 along the sidewalls of the first partial deep trench 134 to form the first N-type sinker implanted layers 140 and along the sidewalls of the second partial deep trench 138 to form the second N-type sinker implanted layers 141. This implant is generally a self-aligned implant through the DT openings without use of a mask. The N-type dopants 139 may be implanted in multiple sub-doses at tilt angles. In one implementation, for example, the tilt angles range from 10 degrees to 30 degrees to provide continuous coverage of the first and second sinker implanted layers 140 and 141 along the respective sidewalls of the first and second partial deep trenches 134 and 138.

The N-type dopants 139 may also be implanted at twist angles of about 45 degrees to reduce the amount of the N-type dopants 139 implanted into bottom surfaces of the first and second partial deep trenches 134 and 138. An example implant process may include four sub-doses rotated at 90 degrees apart, at tilt angles of 10 degrees to 30 degrees, and at twist angles of 45 degrees. Reducing the amount of the N-type dopants 139 implanted into bottom surfaces of the first and second partial deep trench 134 and 138 may advantageously improve the process margin of a second trench etch process subsequent to the first trench etch process.

The N-type dopants 139 in the first deepN sinker implant may be implanted at a total dose of $5 \times 10^{14}$ cm$^{-2}$ to $5 \times 10^{15}$ cm$^{-2}$ (e.g., $2 \times 10^{15}$ cm$^{-2}$) so as to provide desirably low resistance for the subsequent formed sinkers. The N-type dopants 139 may include phosphorus and/or arsenic, or possibly antimony. A pad oxide layer (not shown) may be formed on the sidewalls of the first and second partial deep trenches 134 and 138. If the N-type dopants 139 include arsenic, a pad oxide layer of 30 nanometers of silicon dioxide formed by a PECVD process using TEOS may improve retention of the implanted arsenic in the first and second sinker implanted layers 140 and 141. Alternatively, if the N-type dopants 139 do not include arsenic, a pad oxide on the sidewalls of the first and second partial deep trench 134 and 138 may be omitted because the pad oxide may increase the stress in the substrate 102, which may lead to degrading performance of the semiconductor IC 100.

Implanting the n-type dopants 139 after forming the first and second partial deep trenches 134 and 138 and before forming full deeper trenches therefrom may advantageously prevent the first and second sinker implanted layers 140 and 141 from extending beyond the BL 106. Such a process may also improve a breakdown voltage of the PN junctions in the semiconductor IC 100. Moreover, the first and second partial deep trenches 134 and 138 serve as a self-alignment means for forming the first and second sinker implanted layers 140 and 141, such that no additional mask is required. Because as described above the first aperture AP1 was wider than the second aperture AP2, the first sinker implanted layer 140 has a greater lateral thickness than the second sinker implanted layer 141.

Figure 2E:
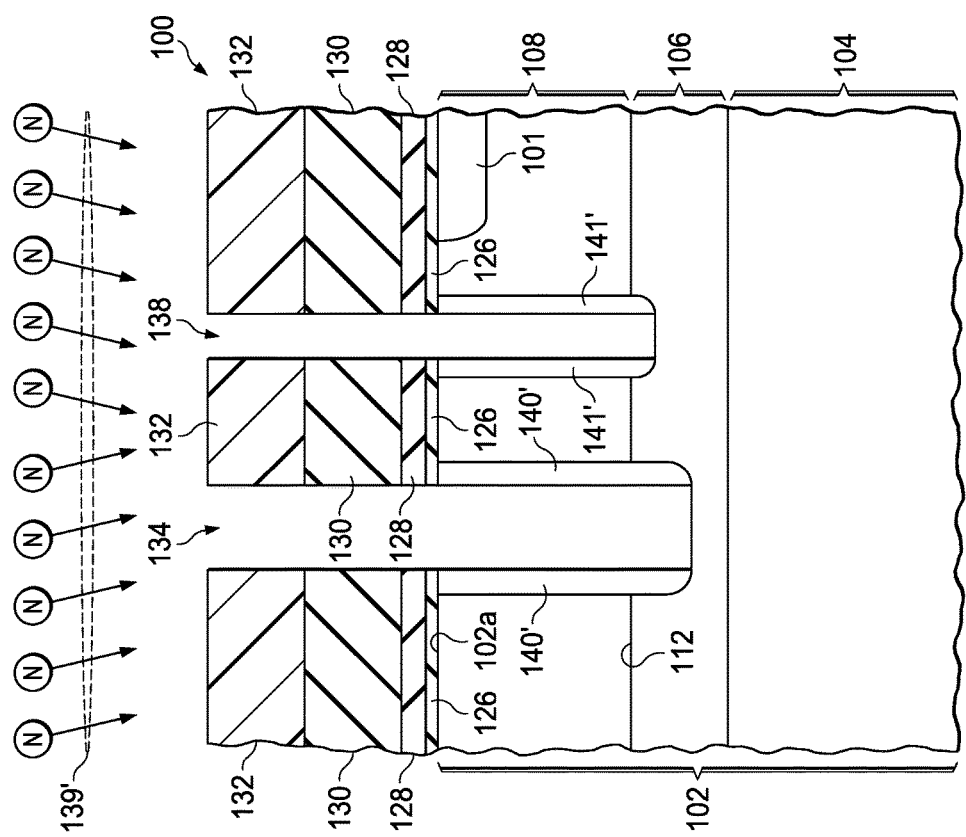

Referring to FIG. 2E, N-type dopants 139' are implanted in a second deepN sinker implant into the substrate 102 including along the sidewalls of the first partial deep trench 134 to add dopant to the first N-type sinker implanted layer now shown as 140' and along the sidewalls of the second partial deep trench 138 to add dopant to the second N-type sinker implanted layer now shown as 141'. This implant is also generally a self-aligned implant through the DT openings without a mask. This second deepN sinker implant solves the above-described high resistance connection problem between sinker and BL around the narrower isolation trenches (which will be formed from the second partial deep trench 138) by adding an additional deepN-type dopant (e.g., phosphorous) using an implantation with a higher energy (or longer projected range if comparing different dopants), smaller tilt angle and a lower implant dose as compared to the first deepN sinker implant. The second deepN sinker implant generally comprises phosphorous due to its relatively long range statistics as compared to the heavier As and even heavier Sb.

For example, the second deepN sinker implant dose is generally≤0.4× the first trench sidewall implant dose, and the implant angle is at least 3 degrees less than the implant angle for the first trench sidewall implant dose. In the case of sinker implants using multiple sub-doses and tilt angles, the second deepN sinker implant dose is generally≤0.4× the first deepN sinker implant dose, and the average dose weighted angle is at least 3 degrees less than the average dose weighted implant angle for the first deepN sinker implant dose. For example, the first deepN sinker implant can comprise a phosphorous dose of $2 \times 10^{15}$ cm$^{-2}$ at 200 keV with 4 rotations at 16 degrees and a 45 degree twist, while the second deepN sinker implant can comprise a phosphorous dose of $4 \times 10^{14}$ cm$^{-2}$ at 350 keV with 4 rotations at 9 to 12 degrees with a 45 degree twist.

Figure 2F:
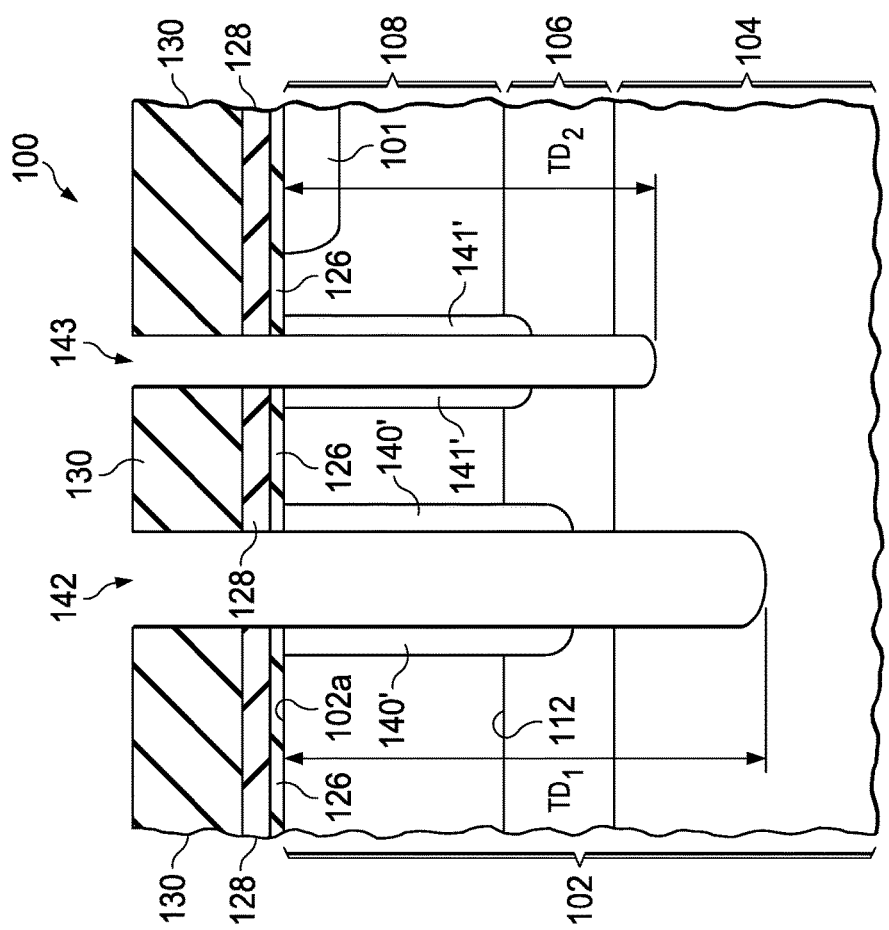

Referring now to FIG. 2F, a second trench etch process is performed to remove additional material from the substrate 102 so as to further extend the first and second partial deep trenches 134 and 138 to simultaneously form a first deep trench 142 and second deep trench 143, respectively. RIE may be used for this step. Because AP1 was wider than AP2, the first deep trench 142 has a first trench depth $TD_1$ greater than a second trench depth $TD_2$ of the second deep trench 143. In one implementation, for example, the first deep trench 142 extends below the BL 106 by at least 17 μm whereas the second deep trench 143 extends below the BL 106 by less than 17 μm. In another implementation, for example, the first deep trench 142 extends below the BL 106 whereas the second deep trench 143 does not extend below the BL 106. Upon the completion of the second trench etch process, substantially all of the remaining trench mask 132.

Figure 2G:
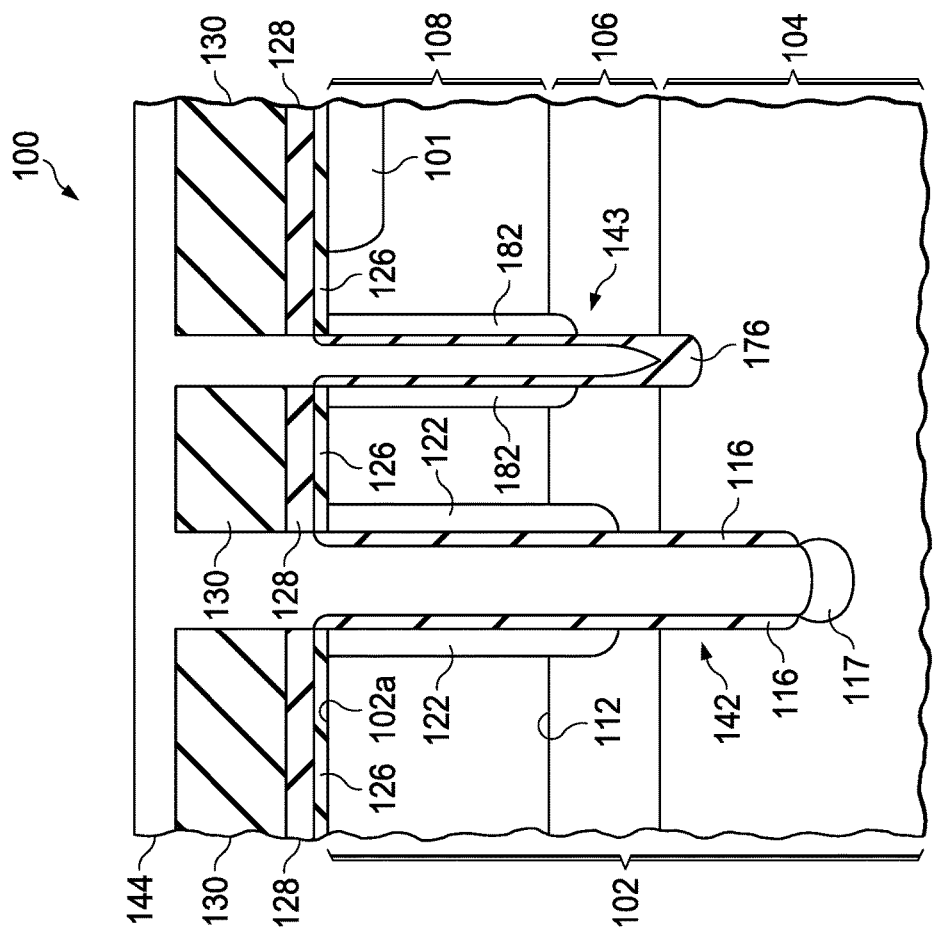

Referring to FIG. 2G, a dielectric deposition process is performed to form first and second dielectric liners 116 and 176 on the sides and bottoms of the first and second deep trenches 142 and 143 respectively. In one implementation, for example, the first dielectric liner 116 and second dielectric liner 176 may each have a thickness ranges from 100 nanometers to 800 nanometers. In another implementation, for example, the first and second dielectric liners 116 and 176 may include a thermal oxide layer having a thickness ranges from 200 nanometers to 300 nanometers on the sides and bottoms of the first and second deep trenches 142 and 143. In yet another implementation, for example, a silicon dioxide layer having a thickness ranges from 300 nanometers to 500 nanometers may be formed on the thermal oxide by a sub-atmospheric chemical vapor deposition (SACVD) process.

Because the first deep trench 142 has a greater trench width compared to the second deep trench 143, the second dielectric liner 176 as shown in FIG. 2G forms a pinch off section around the bottom portion of the second deep trench 143. The first dielectric liner 116 in contrast forms a relatively uniform thickness around the bottom portion of the first deep trench 142. In general, the pinch off section in the second deep trench 143 is thicker than the first dielectric liner 116 around the bottom portion of the first deep trench 142.

Next, an oxide etch process is performed to create a bottom opening within the first deep trench 142 for accessing the lower semiconductor layer 104. Because of the thicker pinch off section, the bottom portion of the second deep trench 143 remains closed to the lower semiconductor layer 104 after the oxide etch process is completed. Upon creating the bottom opening within the first deep trench 142, a P-type doping process (typically a boron implant for a p-type substrate) may be performed to create a contact doped region 117 directly under the bottom opening.

Then, a layer of trench fill material 144 is formed in the first and second deep trenches 142 and 143 on the first and second dielectric liners 116 and 176. In one implementation, for example, the layer of trench fill material 144 may comprise polysilicon that fills in the first and second deep trenches 142 and 143, as well as covering the hard mask oxide layer 130. Alternatively, the layer of trench fill material 144 may include silicon dioxide or other dielectric material for filling the second deep trench 143 where the second deep trench is configured to a floating state.

Thermal processing during formation of the first and second dielectric liners 116 and 176, as well as and the trench fill material 144, cause the implanted N-type dopants in the first and second sinker implanted layers 140' and 141' in FIG. 2F to diffuse and become activated and are now shown as first sinkers 122 and second sinkers 182, respectively in FIG. 2G, that are also shown in FIG. 1B. Advantageously, the first and second sinkers 122 and 182 are formed without requiring a separate annealing process.

Figure 2H:
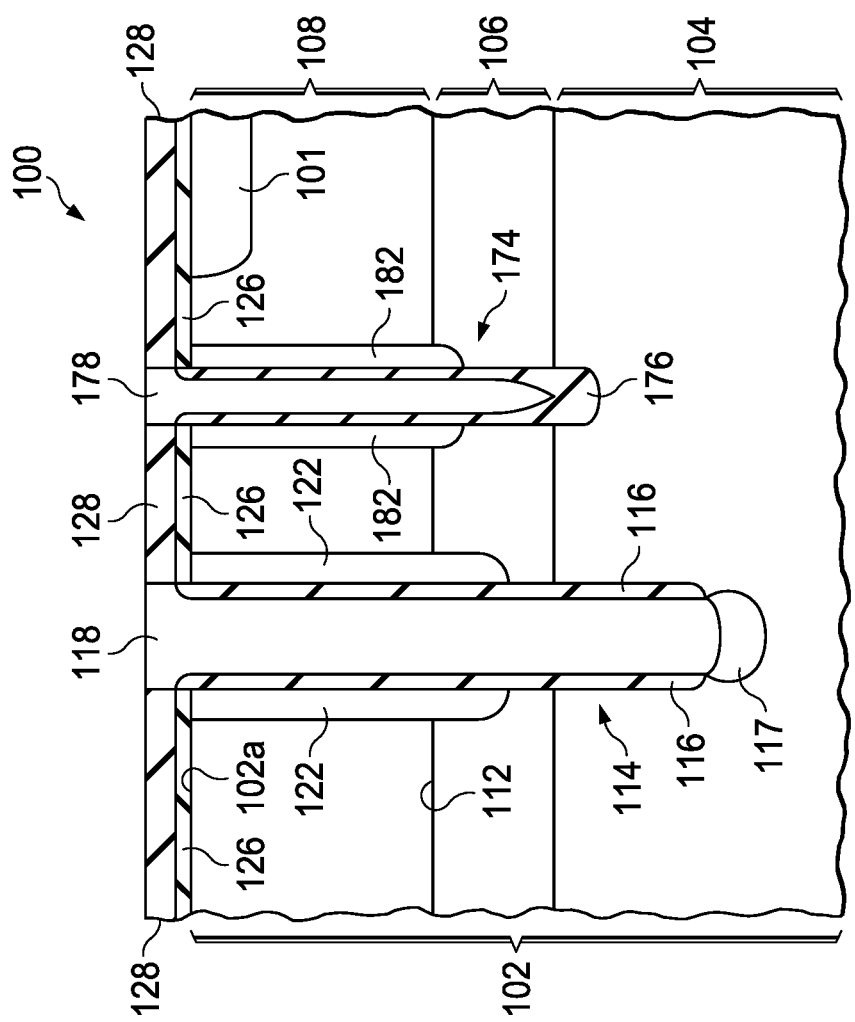

Referring to FIG. 2H, the hard mask oxide layer 130 and the overlying portion of the layer of trench fill material 144 are subsequently removed, for example, by a chemical mechanical polish (CMP) process. The first deep trench 142 and second deep trenches 143 shown in FIG. 2H are now shown as TSC trench 114 and isolation trench 174 in FIG. 2H, to match the TSC trench 114 and isolation trench 174 in FIGS. 1A and 1B described above. As a result, the first trench fill material 118 is left in the TSC trench 114, while the second trench fill material 178 is left in the isolation trench 174. The pad nitride layer 128 serves as an etch stop layer for removal of the hard mask oxide layer 130. The pad nitride layer 128 and the pad oxide layer 126 are subsequently removed, to result in the structure shown in FIGS. 1A and 1B.

Figure 3:
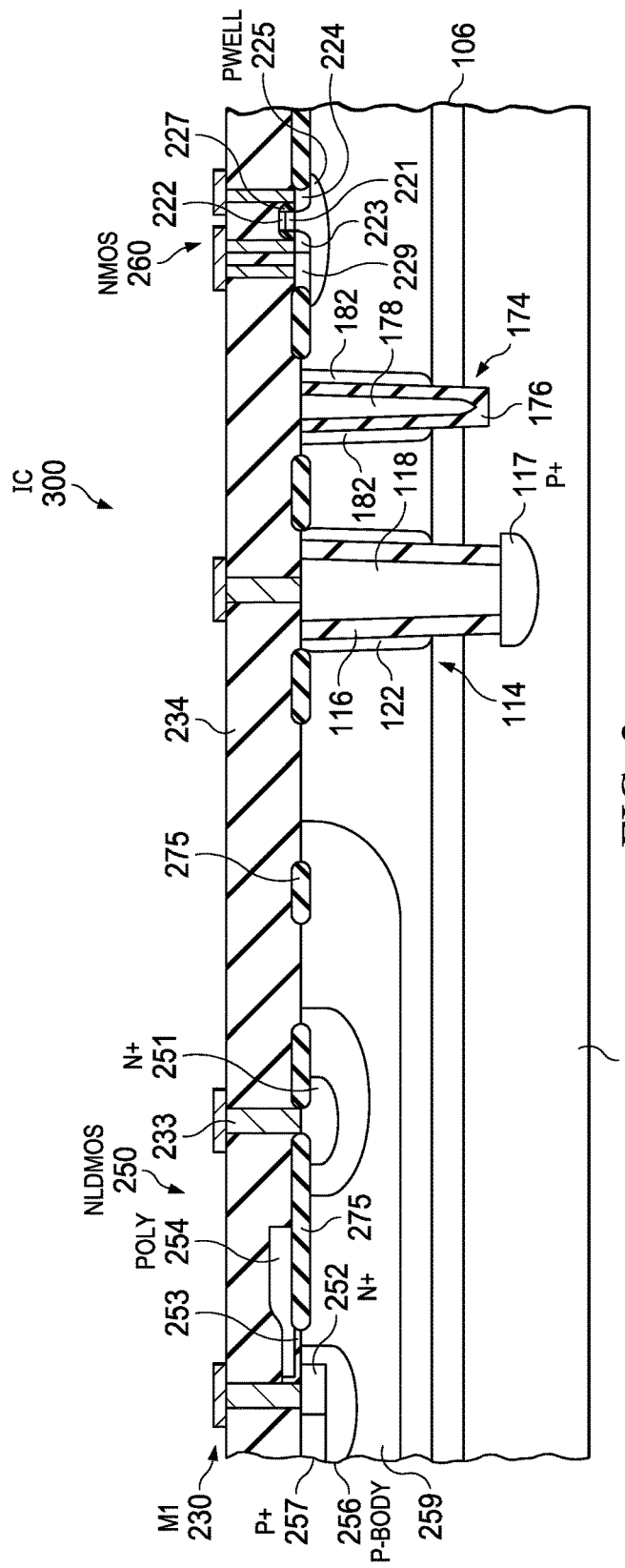
FIG. 3 is a cross sectional view of a portion of a semiconductor IC having high voltage transistors and low voltage transistors that are isolated from one another by dual-trenches including a TSC trench and an isolation trench that includes a sinker including a disclosed sinker to buried layer connection region, according to an example embodiment.

FIG. 3 is a cross sectional view of a portion of a semiconductor IC 300 having high voltage transistors and low voltage transistors in active areas that are isolated from one another by dual-trenches including a TSC trench 114 and an isolation trench 174 having a second sinker 182 that includes a disclosed sinker to buried layer connection region, according to an example embodiment. For simplicity the metal stack is shown as only a patterned metal 1 (Ml) layer 230 connecting through filled (e.g., W filled) vias 233 that are through a pre-metal dielectric layer 234 to provide contact to features in or on the top surface of the substrate 102. Not all needed contacts are shown, such as contacts to the respective gates. Typically, the metal stack will include 4 or more metal layers with an interlevel dielectric (ILD) layer having vias therein between the respective metal layers.

The high voltage transistors shown comprise an NLDMOS transistor 250, and a conventional n-channel MOS (NMOS) transistor 260. The field oxide is shown as a Local Oxidation of Silicon (LOCOS) oxide 275. As used herein, an LDMOS device is synonymous with a diffused (or drain extended) metal oxide semiconductor (DMOS) device and can include both n-channel LDMOS (NLDMOS) and p-channel PLDMOS devices. In NLDMOS transistor 250, the drain 251 is laterally arranged to allow current to laterally flow, and an n-drift region is interposed between the channel and the drain to provide a high drain to source 252 breakdown voltage (BV). The source 252 is in a pbody region 256 (sometimes called a DWELL region) formed in an n-body region 259, where the pbody region 256 has a p+ contact 257. LDMOS devices are thus generally designed to achieve higher BV while minimizing specific ON-resistance in order to reduce conduction power losses. NLDMOS transistor 250 also has a gate electrode 254 such as an n+ polysilicon gate on a gate dielectric layer 253.

The NMOS transistor 260 includes a gate electrode 221 on a gate dielectric 222 along with a drain 223 and source 224 formed in a pwell 225. Spacers 227 are shown on the sidewalls of the gate stack of the NMOS transistor 260. There is also a p+ contact 229 shown to the pwell 225. As well known in the art, the semiconductor IC 300 can also include PMOS devices by generally changing the doping types relative to the NMOS devices.

Examples

Disclosed embodiments of the invention are further illustrated by the following specific Examples, which should not be construed as limiting the scope or content of this Disclosure in any way.

Figure 4:
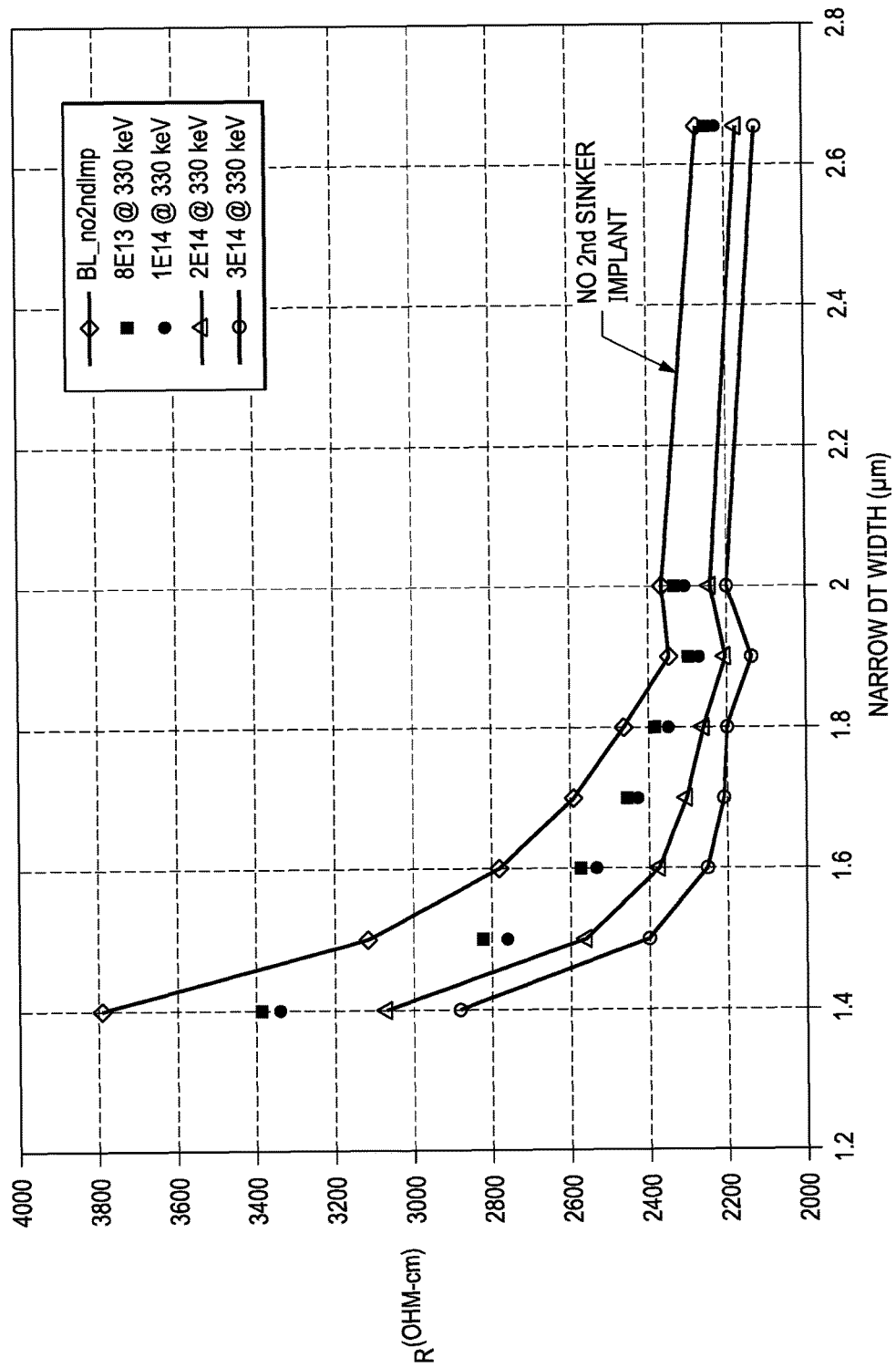
FIG. 4 shows measured resistance data from isolation trench sinker resistance test structures including a control test structure and test structures that received a disclosed implant for forming a disclosed sinker to buried layer connection region for an isolation trench.

Resistance data as a function of isolation trench width (shown as narrow DT trench width) is shown in FIG. 4 for a split wafer lot including a control that received only a first DeepN implant, being phosphorous $2\times10^{15}$ cm$^{-2}$ at 200 keV with 4 rotations at an angle of 16 degrees and a 45 degree twist (with no disclosed second DeepN implant), and for a disclosed process besides the first DeepN implant also received a second DeepN implants shown for various second DeepN implant doses, all being phosphorous implanted at 330 keV. The second deepN sinker implant doses ranged from $8\times10^{13}$ to $3\times10^{14}$ at 330 keV, and were performed with 4 rotations at 9 to 12 degrees with a 45 degree twist. A vertical deep resistance monitor structure was formed used for measuring resistance that basically contacted the inside DeepN sinker on a pair of spaced apart isolation trenches so that the electrical conduction path tested comprised 2 DeepN sinker (vertical) resistors connected in series by a low resistance NBL (lateral) path.

As described above, for first DeepN implant angle of 16 degrees, the max DeepN implant depth is deeper for the 2.65 µm wide TSC trench as compared to the isolation trench that has a width<1.9 µm, having a width for 100V isolation of 1.6+/−0.3 µm. Due to the poor electrical connection between NBL and deepN near the isolation trench, the vertical resistance to reach the NBL increases significantly. The disclosed added 2nd Deep sinker implant with a smaller implant angle (e.g., ~11 degrees) is seen to improve the electrical connection to the NBL because with a smaller implant angle such as 11 degrees, as one can increase the implant energy and thus the DeepN sinker implant depth. From the data provided it can be seen that there is a significant reduction in vertical deepN sinker resistance particularly for trench widths<1.8 µm, with the resistance improvement increasing for a higher implant dose.

Figure 5A:
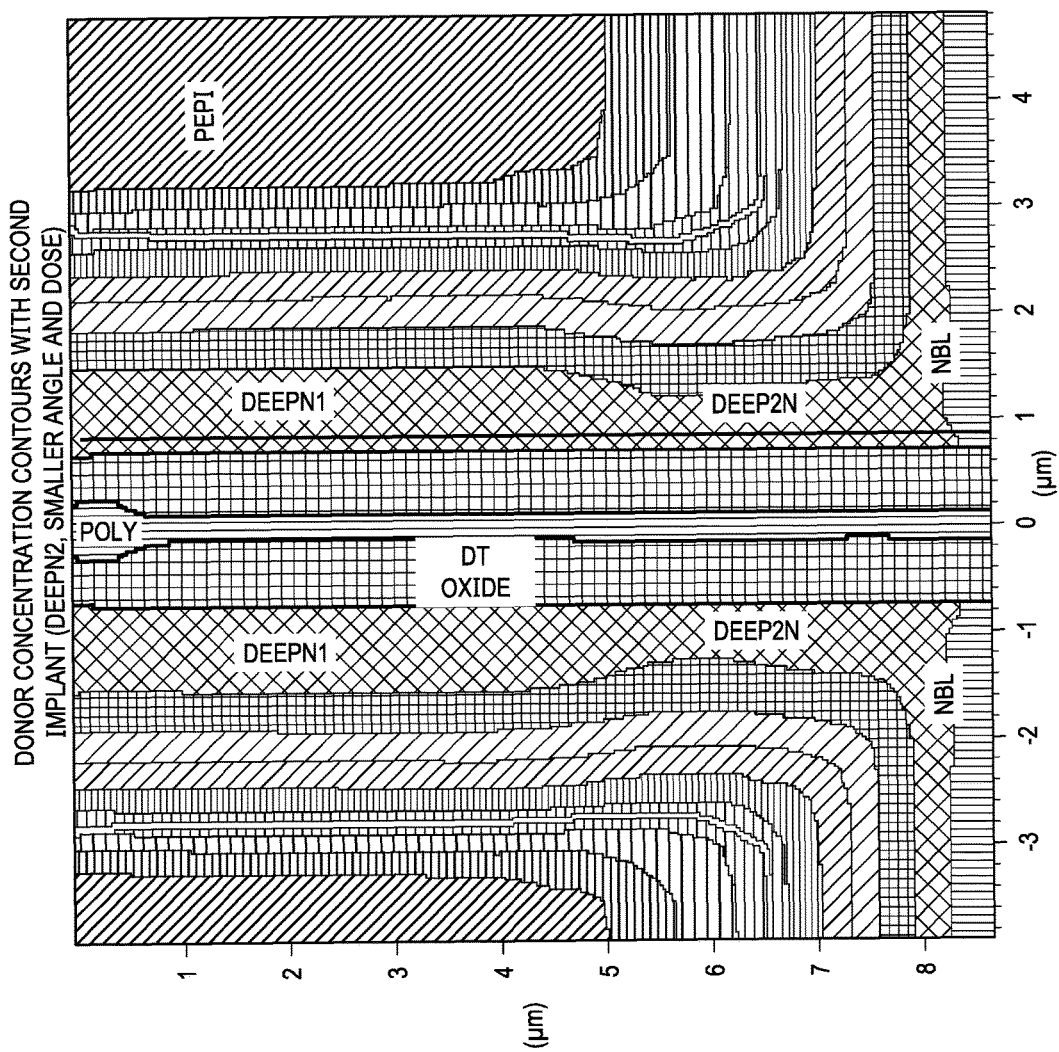
FIG. 5A is a scanning capacitance microscopy (SCM)-derived scanned Atomic-force microscopy (AFM) image showing the donor concentration contours with both a first sinker implant and a disclosed second sinker implant (DEEPN2, smaller angle and dose)
Figure 5B:
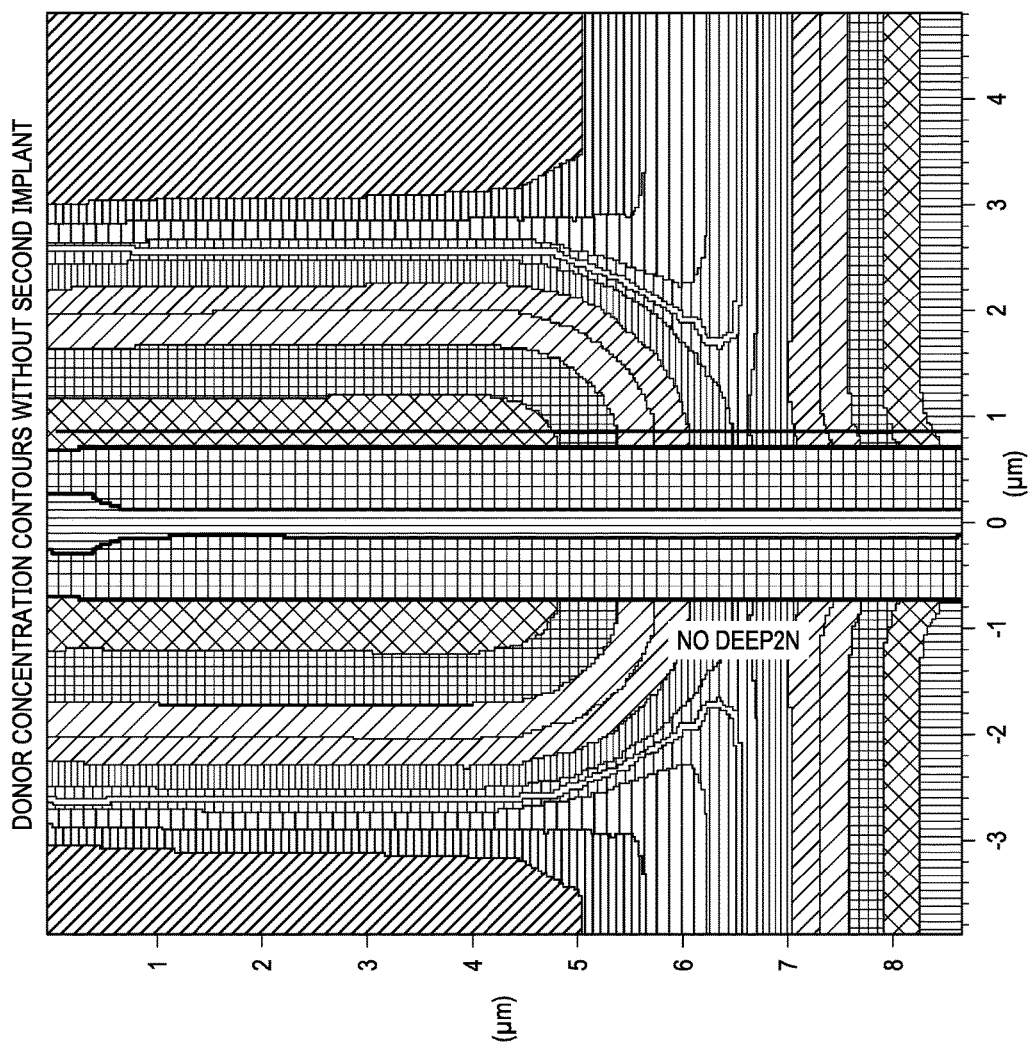
FIG. 5B is a SCM-derived scanned AFM image showing the donor concentration contours with only a first sinker implant (no second sinker implant)
Figure 5C:
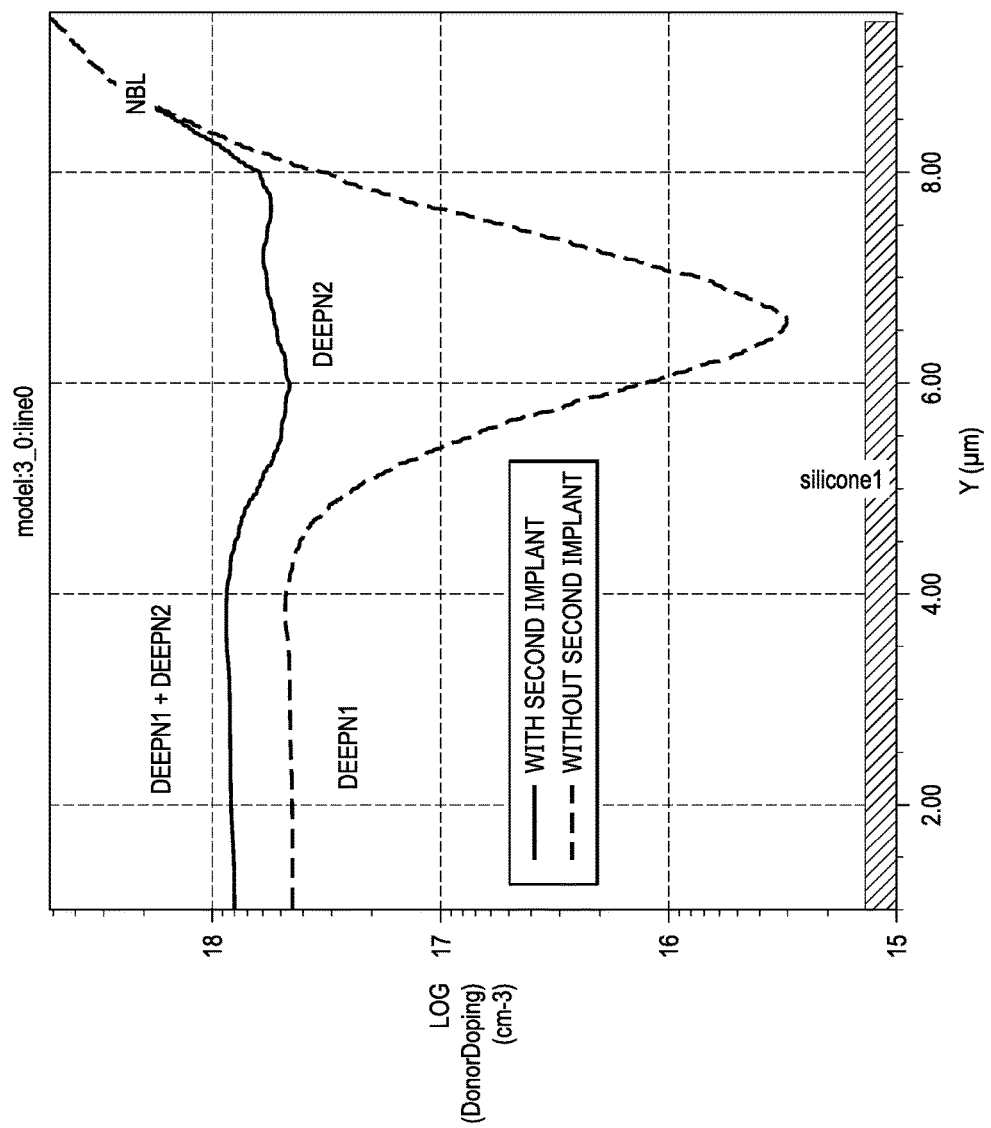
FIG. 5C shows one-dimensional donor concentration profiles in the silicon along the DT sidewall, with a profile shown for a first and a second sinker implant and a profile for only a first sinker implant (no second sinker implant).

Disclosed second sinker implants can be identified in the final IC. FIG. 5A is a SCM-derived scanned AFM image showing the donor concentration contours with both a first sinker implant and a disclosed second sinker implant (DEEPN2, smaller angle and dose), while FIG. 5B is a SCM-derived scanned AFM image showing the donor concentration contours with only a first sinker implant (no second sinker implant). FIG. 5C shows SCM derived one-dimensional donor concentration profiles in the silicon along the DT sidewall, with a profile shown for a first and a second sinker implant and a profile for only a first sinker implant (no second sinker implant). As known in the art, SCM include a conductive metal probe tip and a highly sensitive capacitance sensor in addition to the normal AFM components. The second sinker implant can be seen to fill the doping gap between first sinker implant and the NBL, thus significantly reducing the resistance between the NBL and the contact at the top of the silicon surface.

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure. For example, disclosed sinker to buried layer connection regions for narrow DTs can also be applied to single-DT isolation structures and methods.

The invention claimed is:

1. A method of forming an integrated circuit (IC), comprising:
    forming a buried layer (BL) doped a second type in a substrate having semiconductor surface that is doped a first type;
    etching deep trenches from a top surface of said semiconductor surface through to said BL including narrower inner trench rings with a first trench width and wider outer trench rings having a second trench width that is greater then said first trench width surrounding said inner trench rings;
    first deep sinker implanting using ions of said second type with a first dose, a first energy, and a first tilt angle;
    second deep sinker implanting using ions of said second type with a second dose that is less than (<) said first dose, a second energy that is higher (>) than said first energy, and a second tilt angle that is less than (<) said first tilt angle;
    etching said outer trench rings and said inner trench rings thereby extending their trench depth;
    dielectric lining said outer trench rings and said inner trench rings;
    removing said dielectric lining from a bottom of said outer trench rings, and
    filling said outer trench rings and said inner trench rings with an electrically conductive filler material such that the electrically conductive material within the outer trench rings contacts said substrate.

2. The method of claim 1, wherein said BL comprises an n-type BL (NBL) and said substrate comprises a p-type substrate.

3. The method of claim 1, wherein said electrically conductive filler material comprises polysilicon doped said first type, and wherein said method further comprises bottom implanting using dopants of said first type to form a bottom doped region so that said outer trench rings are top side contact (TSC) trenches.

4. The method of claim 3, wherein said inner trench rings are electrically isolated from said substrate so that said inner trench rings are isolation trenches.

5. The method of claim 4, wherein said IC includes a plurality of transistors connected together to implement a circuit function, said plurality of transistors including at least one laterally diffused metal-oxide-semiconductor (LDMOS) transistor and at least one MOS transistor that are isolated from one another by one of said isolation trenches and one of said TSC trenches.

6. The method of claim 1, wherein said first dose is at least ($\geq$) $5\times10^{14}$ cm$^{-2}$, said second dose is less than or equal to ($\leq$) 40% of said first dose, and said second tilt angle is at least 3 degrees less than (<) said first tilt angle.

7. The method of claim 1, wherein said outer trench rings are spaced apart from said inner trench rings by about 1 µm or greater.

8. The method of claim 1, wherein said inner trench rings are at least 20% narrower as compared to a width of said outer trench rings.

9. The method of claim 1, wherein said second deep sinker implanting comprises phosphorus implanting.

10. A method of forming an integrated circuit (IC), comprising:

forming a buried layer (BL) of a second conductivity type in a substrate of a first conductivity type;

etching trenches from a top surface of the substrate through to said BL including a first trench ring with a first trench width and a second trench ring having a second trench width that is greater then said first trench width, the second trench ring surrounding of the first trench ring;

forming a first sinker adjacent the first trench ring and a second sinker adjacent the second trench ring by:
 implanting using ions of the second conductivity type with a first dose, a first energy, and a first tilt angle; and
 implanting using ions of the second conductivity type with a second dose that is less than (<) the first dose, a second energy that is higher (>) than the first energy, and a second tilt angle that is less than (<) the first tilt angle;

etching to extend the first trench ring to a first depth and the second trench ring to a second depth, wherein the first depth is less than the second depth;

forming a dielectric liner in the second trench ring and the first trench ring;

removing the dielectric liner from a bottom of the second trench ring;

filling said first trench ring; and filling the second trench ring with an electrically conductive filler material that contacts the substrate.

11. The method of claim 10, further comprising forming transistors connected together to implement a circuit function, said transistors including at least one laterally diffused metal-oxide-semiconductor (LDMOS) transistor and at least one MOS transistor that are isolated from one another by the first trench ring and the second trench ring.

12. A method of forming an integrated circuit (IC), comprising:
 forming a first trench having a first width in a semiconductor layer over a substrate;
 forming a second trench having a second lesser width in said semiconductor layer;
 first implanting a dopant into sidewalls of said first and second trench with a first dose and a first tilt angle;
 second implanting said dopant into said sidewalls with a second dose that is less than said first dose and a second tilt angle that is less than said first tilt angle;
 forming a first sidewall liner within said first trench and a second sidewall liner within said second trench;
 removing a bottom portion of said first sidewall liner thereby exposing said semiconductor substrate within said first trench while preserving a bottom portion of said second sidewall liner such that said semiconductor substrate is insulated from said second trench; and
 filling said first trench with a conductive material that contacts said substrate.

13. The method of claim 12, wherein said first trench forms a ring that surrounds said second trench.

14. The method of claim 12, further comprising implanting a dopant into a sidewall of said first trench.

15. The method of claim 12, wherein said second implanting includes implanting said dopant into said sidewalls with a second implant energy that is greater than a first implant energy of said first implanting.

16. The method of claim 12, wherein said second dose is less than about 40% of said first dose.

17. The method of claim 12, wherein said first trench extends through a buried layer located between said semiconductor layer and said substrate.

18. The method of claim 17, wherein said conductive material is insulated from said buried layer by said second sidewall liner.

19. The method of claim 12, further comprising deepening said first and second trenches after said implanting.

20. The method of claim 12, further comprising forming a transistor within an area enclosed by said first trench.

* * * * *